(12) United States Patent
Zhao et al.

(10) Patent No.: US 10,606,107 B2
(45) Date of Patent: Mar. 31, 2020

(54) DISPLAY SUBSTRATE AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Jian Zhao, Beijing (CN); Yudong Liu, Beijing (CN); Huanyu Li, Beijing (CN); Mo Chen, Beijing (CN); Yang Zhang, Beijing (CN); Jilei Gao, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 88 days.

(21) Appl. No.: 15/743,752

(22) PCT Filed: Jul. 28, 2017

(86) PCT No.: PCT/CN2017/094858
§ 371 (c)(1),
(2) Date: Jan. 11, 2018

(87) PCT Pub. No.: WO2018/126657
PCT Pub. Date: Jul. 12, 2018

(65) Prior Publication Data
US 2018/0373070 A1 Dec. 27, 2018

(30) Foreign Application Priority Data

Jan. 4, 2017 (CN) .......................... 2017 1 0005660

(51) Int. Cl.
*G02F 1/1333* (2006.01)
*G02F 1/1362* (2006.01)
(Continued)

(52) U.S. Cl.
CPC .......... *G02F 1/1333* (2013.01); *G02F 1/1368* (2013.01); *G02F 1/13624* (2013.01);
(Continued)

(58) Field of Classification Search
CPC .... G09G 2320/0257; G09G 2300/0413; G02F 1/1333; G02F 2001/133397
See application file for complete search history.

(56) References Cited

U.S. PATENT DOCUMENTS 6,900,853 B2    5/2005  Watanabe et al.
2002/0080133 A1* 6/2002 Eu .................... G09G 3/3648
                                                  345/212
(Continued)

FOREIGN PATENT DOCUMENTS

CN    101408705 A    4/2009
CN    102540586 A    7/2012
(Continued)

OTHER PUBLICATIONS

Search Report for International Application No. PCT/CN2017/094858 dated Oct. 25, 2017.

*Primary Examiner* — Priyank J Shah
(74) *Attorney, Agent, or Firm* — Calfee, Halter & Griswold LLP

(57) ABSTRACT

A display substrate and a display device are disclosed. The display substrate includes an active area and a non-active area, and an afterimage removing device for adsorbing charged ions by forming a potential difference is provided in the non-active area.

18 Claims, 4 Drawing Sheets

(51) Int. Cl.
*G02F 1/1368* (2006.01)
*H01L 27/12* (2006.01)
*G09G 3/36* (2006.01)
*H01L 27/02* (2006.01)

(52) U.S. Cl.
CPC ..... *G02F 1/136286* (2013.01); *G09G 3/3614* (2013.01); *G09G 3/3648* (2013.01); *H01L 27/124* (2013.01); *H01L 27/1255* (2013.01); *G02F 2001/133397* (2013.01); *G09G 2300/0413* (2013.01); *G09G 2310/0232* (2013.01); *G09G 2310/067* (2013.01); *G09G 2320/0257* (2013.01); *H01L 27/0266* (2013.01)

(56) References Cited

U.S. PATENT DOCUMENTS

| | | |
|---|---|---|
| 2003/0086041 A1 | 5/2003 | Watanabe et al. |
| 2005/0200786 A1 | 9/2005 | Watanabe et al. |
| 2011/0075063 A1* | 3/2011 | Tajiri .................. G09G 3/3651 349/42 |
| 2013/0128210 A1* | 5/2013 | Nagasawa ........... G02F 1/13452 349/151 |
| 2013/0147697 A1* | 6/2013 | Sung ................. G02F 1/136204 345/87 |
| 2013/0234919 A1* | 9/2013 | Choi .................... G09G 3/3655 345/92 |
| 2017/0176824 A1* | 6/2017 | Xu ........................ G02F 1/1368 |
| 2017/0255073 A1 | 9/2017 | Wang |
| 2018/0107081 A1* | 4/2018 | Zhao ................. G02F 1/136209 |
| 2018/0240414 A1* | 8/2018 | Yang ..................... G09G 3/3648 |

FOREIGN PATENT DOCUMENTS

| | | |
|---|---|---|
| CN | 105374334 A | 3/2016 |
| CN | 105487312 A | 4/2016 |
| CN | 105741754 A | 7/2016 |
| CN | 106483729 A | 3/2017 |
| WO | 2017096706 A1 | 6/2017 |
| WO | 2017113958 A1 | 7/2017 |

* cited by examiner

DISPLAY SUBSTRATE AND DISPLAY DEVICE

CROSS-REFERENCE TO RELATED APPLICATIONS

The present application is based upon International Application No. PCT/CN2017/094858, filed on Jul. 28, 2017, which is based upon and claims priority to Chinese Patent Application No. 201710005660.2, titled "DISPLAY SUBSTRATE AND DISPLAY DEVICE", filed Jan. 4, 2017, the entire contents of which are incorporated herein by reference.

TECHNICAL FIELD

The present disclosure relates to the technical field of display, and more particularly to a display substrate and a display device.

BACKGROUND

A liquid crystal display (LCD) has advantages of a thin body, low power consumption, no radiation, long service life, etc. Due to these advantages, the liquid crystal display, as a flat panel display device, are widely used in electronic products such as mobile phones, computers, TVs, digital cameras and the like and have dominated the flat panel display market. A liquid crystal panel (LCD panel), as an important part of a liquid crystal display, includes an array substrate and a color filter substrate. The array substrate and the color filter substrate are assembled into a cell to form a liquid crystal panel through a cell assembly process.

With the rapid development of flat panel display technology, the demand for the quality of the LCD panel image is getting higher and higher. Afterimages, as an important aspect of the image quality evaluation, have long drawn widespread attention. When the LCD panel maintains a single image display for a long time, due to the long time influence of an electric field, there is an afterimage on the screen when switching to another image. The main reason for the afterimages is that, some charged ions may be introduced into the LCD panel in the manufacturing process of the LCD panel and the materials thereof. When the LCD panel maintains a single image display for a long time, these charged ions will be separated by the external electric field to form an internal electric field. When the image is switched, the internal electric field generated by the charged particles causes the LCD panel to remain on the previous image, causing an afterimage at the periphery of the active area, referred to as peripheral afterimage.

The peripheral afterimage is an afterimage that often appears in the LCD panel. One of the main reasons for the peripheral afterimage is the contamination of the sealant and the liquid crystals around the LCD panel. The charged ions generated by the contamination are distributed around the LCD panel. When the LCD panel is displaying, the charged ions generate an internal electric field to form the peripheral afterimage.

SUMMARY

Embodiments of the present disclosure provide a display substrate and a display device.

An embodiment of the present disclosure provides a display substrate including an active area and a non-active area, wherein an afterimage removing device for adsorbing charged ions by forming a potential difference is provided in the non-active area.

In an embodiment, the active area includes a gate line, and the afterimage removing device includes: a gate extension line extended from the gate line in the active area, a first voltage line, a second voltage line, and a conductive line coupled between the first voltage line and the second voltage line and disposed opposite to the gate extension line.

In an embodiment, the afterimage removing device further includes: a first voltage dividing circuit, a second voltage dividing circuit, and a control switch, wherein the conductive line is coupled in series between the first voltage dividing circuit and the second voltage dividing circuit, and the control switch includes a first terminal, a second terminal and a control terminal; one terminal of the first voltage dividing circuit is coupled to the first voltage line and the other terminal of the first voltage dividing circuit is coupled to the conductive line, one terminal of the second voltage dividing circuit is coupled to the conductive line and the other terminal of the second voltage dividing circuit is coupled to the first terminal of the control switch, and the second terminal of the control switch is coupled to the second voltage line and the control terminal of the control switch is coupled to the gate extension line.

In an embodiment, when the control switch is turned on, a voltage applied by the control terminal is not equal to a voltage of the conductive line.

In an embodiment, the first voltage line is a positive voltage line, the second voltage line is a negative voltage line, the control terminal is at a high voltage, the control switch is turned on, and the control switch is an N-type thin film transistor.

In an embodiment, the first voltage line is a positive voltage line, the second voltage line is a negative voltage line, the control terminal is at a low voltage, the control switch is turned on, and the control switch is a P-type thin film transistor.

In an embodiment, the first voltage line is a negative voltage line, the second voltage line is a positive voltage line, the control terminal is at a high voltage, the control switch is turned on, and the control switch is an N-type thin film transistor.

In an embodiment, the first voltage line is a negative voltage line, the second voltage line is a positive voltage line, the control terminal is at a low voltage, the control switch is turned on, and the control switch is a P-type thin film transistor.

In an embodiment, the first voltage dividing circuit is a first resistor and the second voltage dividing circuit is a second resistor.

In an embodiment, the resistances of the first resistor and the second resistor satisfy the following condition:

$$VL = \frac{R_2 * V^+}{R_1 + R_2} + \frac{R_1 * V^-}{R_1 + R_2}$$

where VL denotes a voltage of the conductive line when the first terminal and the second terminal are conducted, $R_1$ and $R_2$ denote the resistances of the first resistor and the second resistor respectively, $V^+$ and $V^-$ respectively represent a positive voltage of the positive voltage line and a negative voltage of the negative voltage line.

In an embodiment, the afterimage removing device includes: a positive voltage line, a negative voltage line, a gate extension line extended from the gate line in the active area, and a first thin film transistor, a second thin film transistor and a conductive line disposed opposite to the gate extension line, wherein the gate electrode of each thin film transistor is electrically coupled to the gate extension line, the conductive line is coupled in series between a source electrode of the first thin film transistor and a drain electrode of the second thin film transistor, a drain electrode of the first thin film transistor is coupled to the positive voltage line, and a source electrode of the second thin film transistor is coupled to the negative voltage line.

In an embodiment, each conductive line and a corresponding gate extension line are parallel to each other.

An embodiment of the present disclosure provides a display device including the display substrate described above.

BRIEF DESCRIPTION OF THE DRAWINGS

To describe the technical solutions in the embodiments of the present disclosure more clearly, the following briefly introduces the accompanying drawings required for describing the embodiments. Apparently, the accompanying drawings in the following description show merely some embodiments of the present disclosure, those skilled in the art can obtain other drawings according to the accompanying drawings without creative efforts.

DETAILED DESCRIPTION

Figure 1:
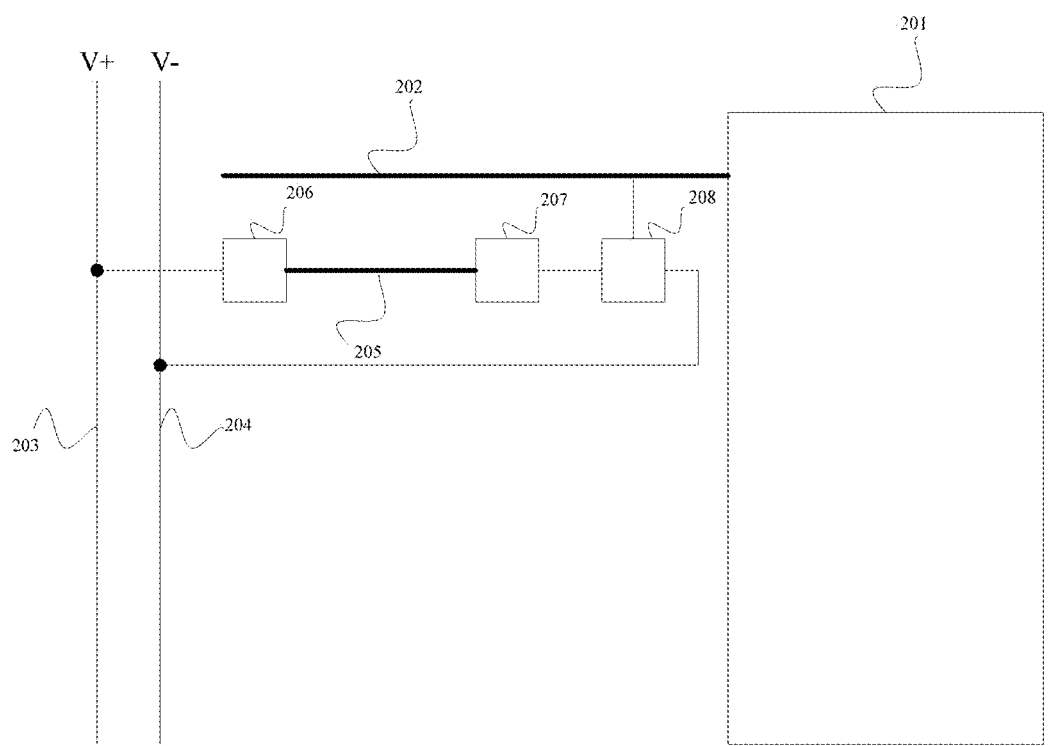
FIG. 1 is a schematic structural diagram of a display substrate according to an embodiment of the present disclosure.

Embodiments of the present disclosure provide a display substrate and a display device, for eliminating or alleviating the problem of peripheral afterimage of the active area.

An embodiment of the present disclosure provides a display substrate structure of a liquid crystal display (LCD) with the function of alleviating or eliminating the peripheral afterimage. With respect to the problem of peripheral afterimage often appearing to the LCD panel, at the periphery of the active area (AA) of the LCD panel, specifically in an area between non-AA area sealant and the AA (hereinafter referred to as a dummy area of the display panel), an afterimage removing device for adsorbing charged ions by forming a potential difference is provided.

The afterimage removing device in the embodiments of the present disclosure may have a plurality of specific implementations, and so long as the afterimage removing device forms a potential difference for adsorbing charged ions, the object of the present disclosure may be achieved.

For example, the display substrate described in the embodiments of the present disclosure includes a gate line in the active area. The afterimage removing device includes: a gate extension line extended from the gate line in the active area, a first voltage line, a second voltage line, and a conductive line coupled between the first voltage line and the second voltage line and disposed opposite to the gate extension line.

A voltage signal is applied to the conductive line coupled between the first voltage line and the second voltage line and disposed opposite to the gate extension line via the first voltage line and the second voltage line, so as to form a potential difference between the conductive line and the gate extension line.

Further, the afterimage removing device also includes a first voltage dividing circuit, a second voltage dividing circuit and a control switch. The conductive line is coupled in series between the first voltage dividing circuit and the second voltage dividing circuit. The control switch includes three terminals, which are respectively a first terminal, a second terminal and a control terminal. One terminal of the first voltage dividing circuit is coupled to the first voltage line, and the other terminal of the first voltage dividing circuit is coupled to the conductive line. One terminal of the second voltage dividing circuit is coupled to the conductive line, and the other terminal of the second voltage dividing circuit is coupled to the first terminal of the control switch. The second terminal of the control switch is coupled to the second voltage line, and the control terminal thereof is coupled to the gate extension line.

When the control switch is turned on, the voltage applied by the control terminal is not equal to the voltage of the conductive line, such that a potential difference is formed between the conductive line and the gate extension line.

Further, the first voltage line is a positive voltage line, the second voltage line is a negative voltage line, the control terminal is at a high voltage, the control switch is turned on, and the control switch is an N-type thin film transistor.

In an embodiment, the first voltage line is a positive voltage line, the second voltage line is a negative voltage line, the control terminal is at a low voltage, the control switch is turned on, and the control switch is a P-type thin film transistor.

In an embodiment, the first voltage line is a negative voltage line, the second voltage line is a positive voltage line, the control terminal is at a high voltage, the control switch is turned on, and the control switch is an N-type thin film transistor.

In an embodiment, the first voltage line is a negative voltage line, the second voltage line is a positive voltage line, the control terminal is at a low voltage, the control switch is turned on, and the control switch is a P-type thin film transistor.

The first voltage line and the second voltage line may both be positive voltage lines or negative voltage lines, and so long as the voltage applied to the control terminal is not equal to the voltage of the conductive line, it may form a potential difference between the conductive line and the gate extension line.

For example, referring to FIG. 1, the afterimage removing device in the embodiment of the present disclosure includes a positive voltage line 203, a negative voltage line 204, a gate extension line 202 extended from the gate line in the active area 201, and a first voltage dividing circuit 206, a second voltage dividing circuit 207, a control switch 208 and a conductive line 205 disposed opposite to the gate extension line. The conductive line 205 is coupled in series between the first voltage dividing circuit 206 and the second voltage dividing circuit 207. The control switch 208 includes three terminals, which are respectively a first terminal, a second terminal and a control terminal. The control switch 208 is controlled to couple or decouple the first terminal and the second terminal under the positive and negative voltages of the gate extension line 202.

The positive voltage line 203, the negative voltage line 204, the first voltage dividing circuit 206, the second voltage dividing circuit 207 and the control switch 208 may be coupled in various ways. For example, as shown in FIG. 1, one terminal of the first voltage dividing circuit 206 is coupled to the positive voltage line 203 and the other terminal of the first voltage dividing circuit 206 is coupled to the conductive line 205. One terminal of the second voltage dividing circuit 207 is coupled to the conductive line 205 and the other terminal of the second voltage dividing circuit 207 is coupled to the first terminal of the control switch 208. The second terminal of the control switch 208 is coupled to the negative voltage line 204, and the control terminal thereof is coupled to the gate extension line 202.

It should be noted that the structure shown in FIG. 1 is merely an example. Based on this structure, many other similar structures are conceivable. For example, it is also possible that one terminal of the first voltage dividing circuit 206 is coupled to the negative voltage line 204 and the other terminal of the first voltage dividing circuit 206 is coupled to the conductive line; one terminal of the second voltage dividing circuit 207 is coupled to the conductive line and the other terminal of the second voltage dividing circuit 207 is coupled to the first terminal of the control switch 208; and the second terminal of the controlling switch 208 is coupled to the positive voltage line 203 and the control terminal thereof is coupled to the gate extension line 202.

There are many gate lines (or gate drive lines) in the AA area. In FIG. 1, only one gate line from which a gate extension line is extended is shown. Similarly, a gate extension line may be extended from each gate line. Each gate extension line may correspond to one conductive line, two voltage dividing circuits and one control switch. That is, each gate extension line may individually form an electric field with one conductive line to absorb positive and negative charged ions, thereby eliminating or alleviating the peripheral afterimage of the active area.

In an embodiment, the control switch 208 is a thin film transistor, the control terminal is a gate electrode, the first terminal is a source electrode, and the second terminal is a drain electrode. Alternatively, the first terminal is a drain electrode, and the second terminal is a source electrode. That is, the thin film transistor may be a PMOS or an NMOS, so long as it may be turned on or off under the effect of the gate extension line and the negative voltage line so as to form a positive-negative potential difference between the gate extension line and the conductive line.

In an embodiment, the positive voltage line 203 and the negative voltage line 204 are parallel to each other and perpendicular to the gate line.

However, the positive voltage line and the negative voltage line being parallel to each other and perpendicular to the gate line is only a preferable implementation. This implementation may make the circuit structure more regular, the occupying space less and the manufacturing process simpler. It is also possible that the positive voltage line and the negative voltage line are both curved lines or not parallel to each other, and the positive voltage line and the negative voltage line are not perpendicular to the gate line, which will not affect the achievement of the object of the present disclosure.

In an embodiment, the first voltage dividing circuit is a first resistor and the second voltage dividing circuit is a second resistor.

First Embodiment

Figure 2:
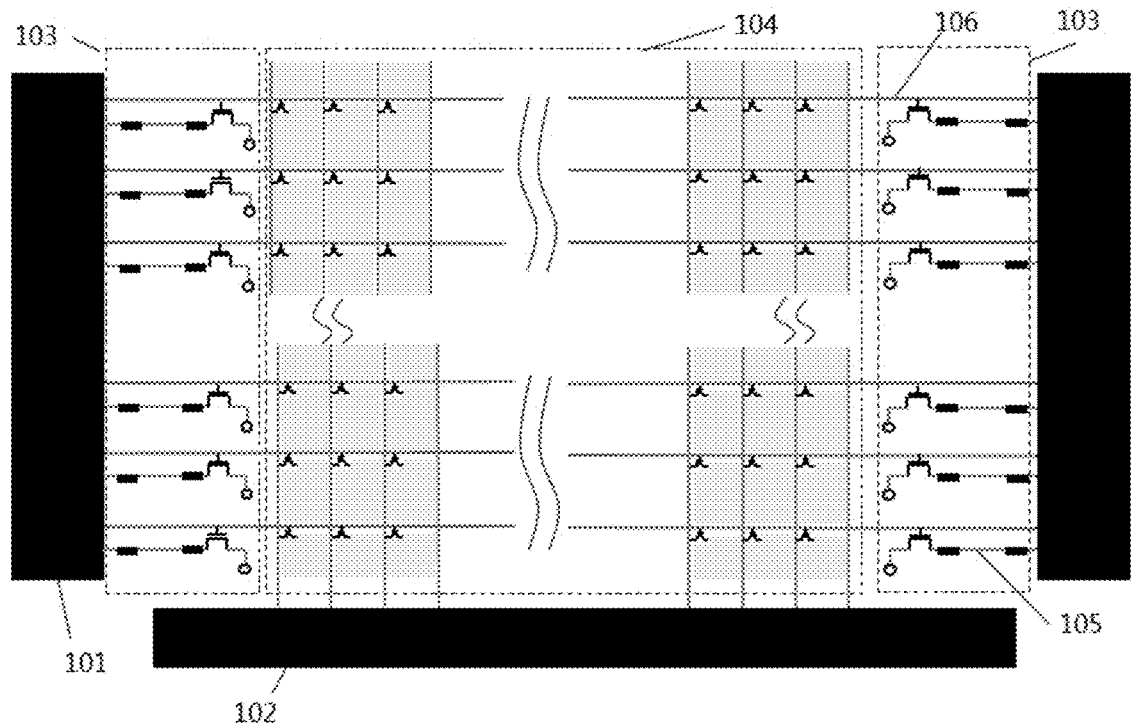
FIG. 2 is a schematic structural diagram of a display substrate according to an embodiment of the present disclosure.

Taking the structure shown in FIG. 1 as an example, specifically, referring to FIG. 2, for example, an afterimage removing device includes a conductive line 105 (which may also be referred to as a dummy line in the embodiments of the present disclosure). Each dummy line is provided thereon 2 resistors and 1 thin film transistor (TFT) switch. The TFT switch is coupled to a gate extension line 106 corresponding to the dummy line. Under the control of the gate line, each dummy line has an opposite voltage from that of the corresponding gate line, which generates a potential difference to adsorb positive and negative charged ions in the liquid crystal at the periphery of the LCD panel. Thereby, it may effectively solve the problem of peripheral afterimage of the LCD panel and improve display quality of the LCD panel.

Referring to FIG. 2, the display panel includes gate lines and data lines intersecting each other in vertical and horizontal directions. Pixel units are located in the AA area 104 of the display panel. Each of the pixel units in the AA area 104 includes a thin film transistor and a pixel electrode. The thin film transistor has a gate electrode coupled to the gate line, a source electrode coupled to the data line, and a drain electrode coupled to the pixel electrode.

In FIG. 2, 101 represents a gate scanning drive circuit of the substrate, 102 represents a data driving circuit of the substrate, 103 represents a dummy area on the substrate, 104 represents an AA area on the substrate, and 106 represents a gate extension line extended from the gate line in the active area (which may also be understood as a gate scan line). 105 represents a dummy line provided in the dummy area 103. Two terminals of the dummy line 105 are respectively coupled to resistors. One resistor is coupled to the control switch, and the other resistor is coupled to a positive voltage line (not shown in FIG. 2). The control switch is also coupled to a negative voltage line (not shown in FIG. 2). The specific design details of the dummy area of the display substrate are shown in FIG. 3.

Figure 3:
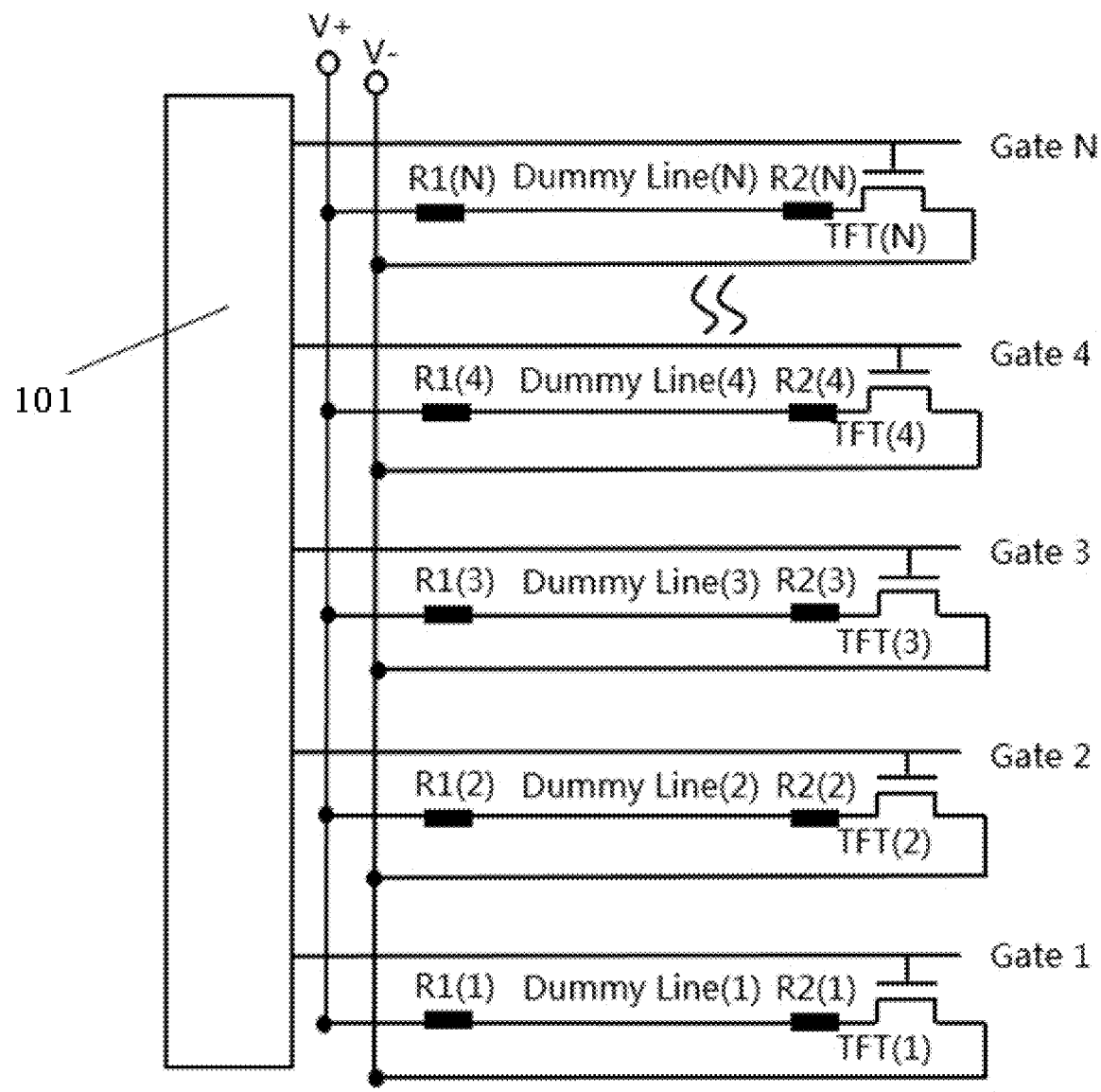
FIG. 3 is a schematic diagram of a connection relationship between a gate extension line and a newly added conductive line, resistors and a TFT in a non-active area on a display substrate according to an embodiment of the present disclosure.

In FIG. 3, gate extension lines Gate 1, Gate 2, Gate 3, Gate 4, . . . Gate N are formed in the dummy area (which may be at one side or multiple sides) at the periphery of the AA area of the display panel. A dummy line is provided at a position corresponding to and parallel to (it is not necessarily parallel to, but only as an implementation) each gate scan line. Two resistors $R_1$ (i), $R_2$ (i) and one TFT (i) are disposed with each dummy line, where i denotes a serial number of the gate extension line, which is a positive integer and less than or equal to N. That is, for a dummy line (i)

corresponding to a gate extension line i, there is provided resistors $R_1$ (i), $R_2$ (i) and one TFT (i), and the dummy line (i) is coupled between $R_1$ (i) and $R_2$ (i). $R_1$ (i) and $R_2$ (i) have a voltage-dividing function when TFT (i) is turned on.

When the TFT is an NMOS, the gate electrode of the TFT switch is coupled to the gate extension line corresponding to the dummy line. The drain electrode of the TFT switch is coupled to $R_2$ (i), and the source electrode of the TFT switch is coupled to the negative voltage line (V−). $R_1$ (i) is coupled to the positive voltage line (V+).

It should be noted that, the structure shown in FIG. 3 is merely an example. The positions of the two resistors, the dummy line and the TFT corresponding to each gate extension line may also be adjusted. For example, the two resistors and the dummy line may also be disposed at the source side of the TFT; and the drain electrode of the TFT is directly coupled to the positive voltage line (V+). In addition, TFT may also be a PMOS. Correspondingly, the position and coupling of the two resistors, the dummy line and the TFT are adjusted, such that it may form a positive-negative potential difference between the gate-line extension line and the dummy line under the effect of the gate extension line, the positive voltage line, the negative voltage line, the TFT and the two voltage-dividing resistors. That is, the positive ions and negative ions at the periphery of the active area may be adsorbed. The specific coupling is the same as that in the above implementation, which will not be repeated herein.

Figure 4:
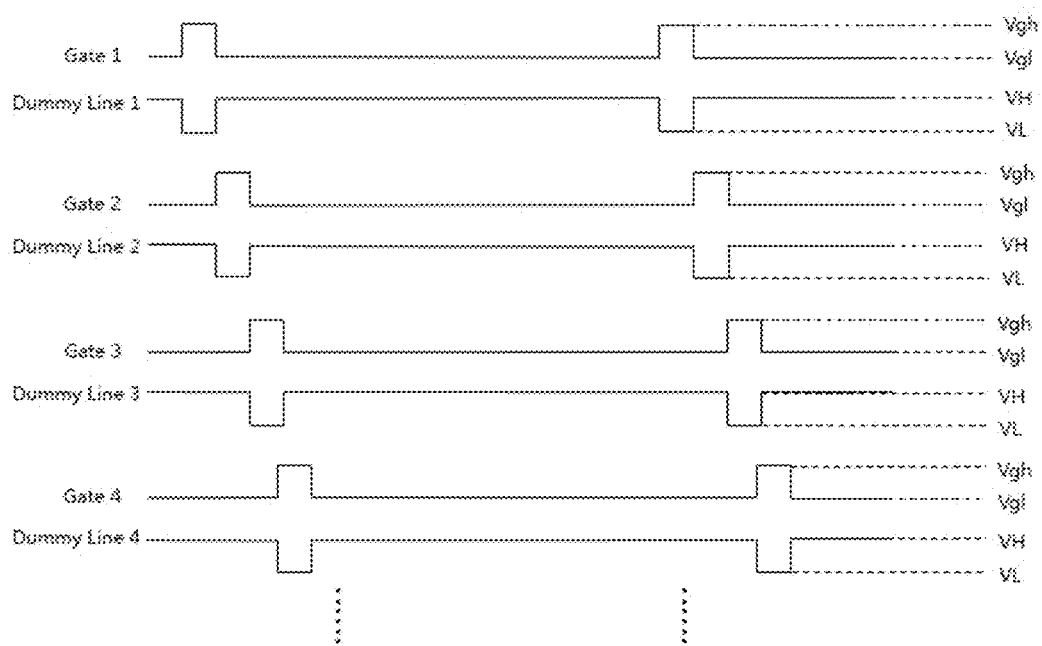
FIG. 4 is a schematic diagram of timing sequences of voltages of a gate extension line and a newly-added conductive line in a non-active area on a display substrate according to an embodiment of the present disclosure.

In an embodiment, referring to FIG. 4, if the voltage of the gate extension line and the voltage of the dummy line respectively are opposite positive and negative voltages at the same time, a potential difference may be formed for absorbing positive and negative ions, which will more effectively alleviate or eliminate the peripheral afterimage of the active area.

In the following, taking the case that the TFT in the afterimage removing device is an NMOS, and the structure shown in FIG. 2 and FIG. 3 as an example, how a potential difference as shown in FIG. 4 is generated between the gate-line extension line and the dummy line in the embodiment of the present disclosure will be specifically described.

Under a normal display condition, each gate scan line outputs a normal scan pulse as shown in FIG. 4. The high level of the scan pulse is generally referred to as Vgh (positive voltage) and the low level is referred to as Vgl (low voltage). The following will be described taking an $N^{th}$ gate scan line as an example (it applies similarly to the other gate scan lines). In this case, an $N^{th}$ dummy line, a switch TFT (N) and two resistors R1 (N) and R2 (N) are provided at a position opposite and in parallel to the $N^{th}$ gate scan line.

Figure 5:
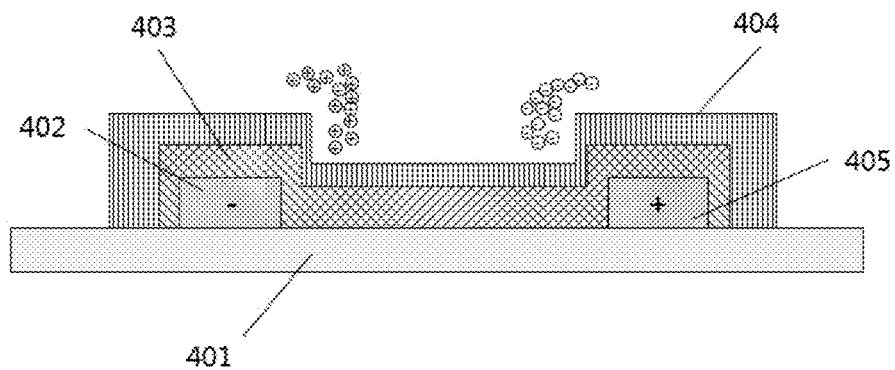
FIG. 5 is a schematic diagram of forming a potential difference between a gate extension line and a newly added conductive line in a non-active area on a display substrate, to adsorb charged ions according to an embodiment of the present disclosure.

When the $N^{th}$ gate scan line is at a low level (Vgl, negative voltage), it may be known from the NMOS principle that the TFT (N) is turned off at this time, that is, the source electrode and the drain electrode of the switch are decoupled. At this time, the voltage of the dummy line (N) is VH=V+. At this time, the gate extension line in the dummy area and the corresponding dummy line respectively have opposite positive and negative voltages, as shown in FIG. 4, to form a positive-negative potential difference that absorbs positive and negative charged ions inside the liquid crystals at the periphery of the AA area of the LCD panel to the dummy area. The specific schematic diagram of adsorbing ions is shown in FIG. 5, in which 401 represents a glass substrate, 402 represents a gate extension line, 403 represents a gate insulation layer (GI layer), 404 represents a passivation layer (PVX layer), and 405 represents a corresponding dummy line.

When the $N^{th}$ gate scan line is at a high level (Vgh, positive voltage), according to the working principle of the NOMS, the TFT (N) is turned on at this time, that is, the source electrode and the drain electrode of the TFT (N) are conducted. The voltage of the dummy line (N) is represented by VL at this time. As shown in FIG. 4, the value of VL is determined by V+, V−, R1 (N) and R2 (N). That is, $$VL = \frac{R_2 * V^+}{R_1 + R_2} + \frac{R_1 * V^-}{R_1 + R_2}$$

Where VL denotes the voltage of the dummy line (N) when the source electrode and the drain electrode of the TFT (N) are conducted, $R_1$ and $R_2$ denote resistance values of R1 (N) and R2 (N), respectively, and $V^+$ and $V^-$ respectively denote positive voltage of the positive voltage line and negative voltage of the negative voltage line.

Figure 6:
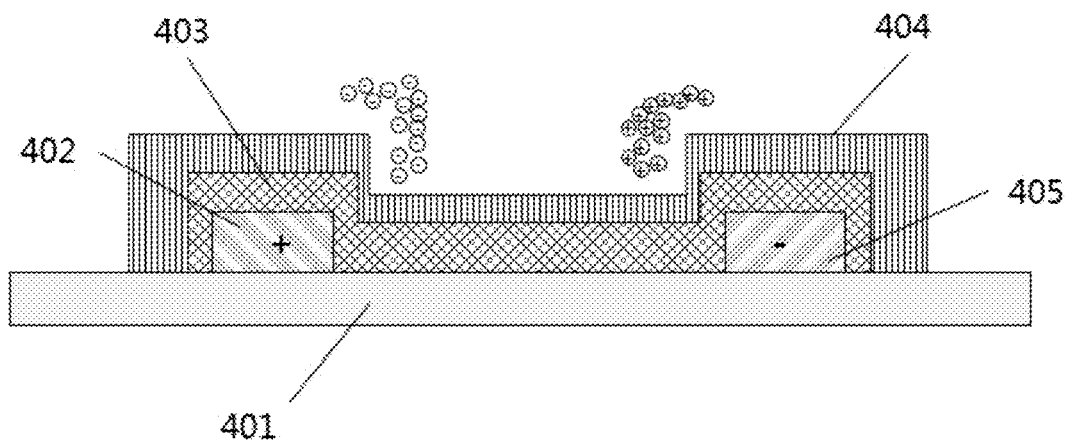
FIG. 6 is a schematic diagram of forming a potential difference between a gate extension line and a newly added conductive line in a non-active area on a display substrate, to adsorb charged ions according to an embodiment of the present disclosure.

By properly configuring the resistances of R1 (N) and R2 (N) and the voltages of V+ and V−, the VL voltage may be obtained as a negative voltage. That is, as shown in FIG. 4, the gate extension line and the corresponding dummy line in the dummy area have opposite positive and negative voltages respectively, to form a positive-negative potential difference that absorbs positive and negative charged ions inside the liquid crystals at the periphery of the AA area of the LCD panel to the dummy area. The specific schematic diagram of adsorbing ions is shown in FIG. 6.

Similarly, the signals of the remaining gate scan lines and their corresponding dummy lines may be inferred as above.

In summary, in the embodiment of the present disclosure, while the gate scan lines normally drive the pixel units in the AA area, each gate extension line and the corresponding dummy line respectively have opposite positive and negative voltages in the dummy area of the LCD panel, which generates a positive-negative potential difference that absorbs positive and negative charged ions inside the liquid crystals at the periphery of the AA area of the LCD panel to the dummy area. It may significantly improve or eliminate the problem of peripheral afterimage of the LCD panel and improve the display quality of the LCD panel.

In the embodiment of the present disclosure, if each of the dummy lines needs two voltages of V+ and V−, only two signal transmission lines are needed to be disposed in the dummy area at each side to implement the voltage transmission. Moreover, two resistors R1 (*i*) and R2 (*i*) are required for an $i^{th}$ dummy line, and the configurations of the resistors may be set by a peripheral circuit. The configuration of the two resistors R1 (N) and R2 (N) may also be implemented by arranging TFT switches with different width-to-length ratios on the TFT display substrate (the larger the width-to-length ratio of the TFT is, the smaller the resistance is). This process may be completed during manufacturing of the TFT display substrate without any additional process.

Second Embodiment

The above resistors R1 (N) and R2 (N) may be equivalently replaced with TFTs. That is, the same effect may be achieved by providing two TFTs without providing two voltage-dividing resistors. Therefore, in an embodiment, the afterimage removing device provided by the embodiments of the present disclosure includes: a positive voltage line, a negative voltage line, a gate extension line extended from the gate line in the active area, and a first thin film transistor, a second thin film transistor and a conductive line disposed opposite to the gate extension line. The gate electrode of each thin film transistor is electrically coupled to the gate extension line. The conductive line is coupled in series between the source electrode of the first thin film transistor and the drain electrode of the second thin film transistor. The drain electrode of the first thin film transistor is coupled to the positive voltage line, and the source electrode of the second thin film transistor is coupled to the negative voltage line.

Figure 7:
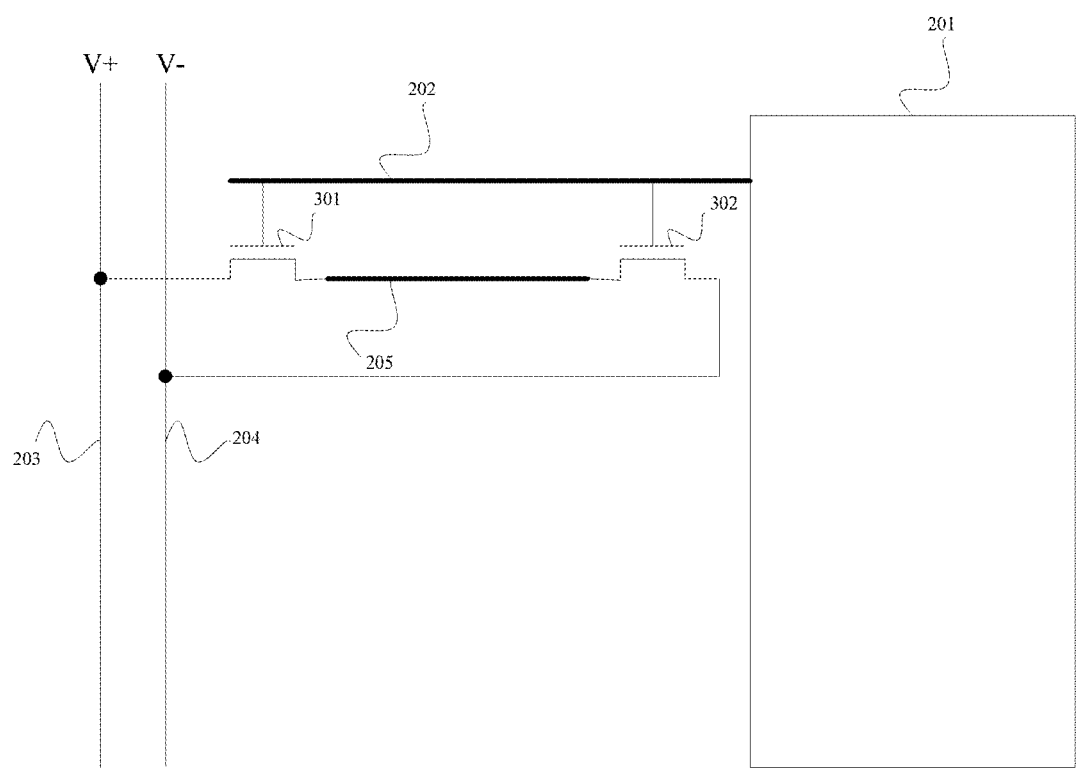
FIG. 7 is a schematic structural diagram of a display substrate according to an embodiment of the present disclosure.

For example, referring to FIG. 7, the afterimage removing device includes a positive voltage line 203, a negative voltage line 204, a gate extension line 202 extended from the gate line in the active area, and a first thin film transistor 301, a second thin film transistor 302 and a conductive line 205 disposed opposite to the gate extension line. The gate electrode of each thin film transistor is electrically coupled to the gate extension line. The conductive line is coupled in series between the source electrode of the first thin film transistor 301 and the drain electrode of the second thin film transistor 302. The drain electrode of the first thin film transistor 301 is coupled to the positive voltage line 203 and the source electrode of the second thin film transistor 302 is coupled to the negative voltage line 204.

The first thin film transistor 301 and the second thin film transistor 302 may both be NMOSs. However, similarly, the first thin film transistor 301 and the second thin film transistor 302 may also be implemented with PMOSs, and the coupling between the source electrode, the drain electrode, the positive voltage line 203 and the negative voltage line 204 may be changed accordingly. It this case, it may also achieve an effect of eliminating or alleviating the peripheral afterimage, which will not be repeated herein.

When providing two TFTs to equivalently replace two resistors, as long as the above formula is satisfied, that is, the gate extension line is in positive or negative voltage condition while the dummy line is in an opposite voltage condition, such that a potential difference is generated between the gate extension line and the dummy line, it may eliminate or alleviate peripheral afterimage.

In the embodiment of the present disclosure, the TFTs on the dummy line and the TFT switches in the panel are subject to the same manufacturing process. The manufacturing of the TFT switches on the dummy line may be completed while manufacturing the TFT switches inside the panel, and the width-to-length ratio of the TFT on the dummy line needs to be properly configured. In addition, the TFTs on the dummy line may be kept in turned-on state, that is, the gate electrode of the TFT does not need to be controlled separately, but always being applied with a high voltage to keep the TFT in a turned-on state to satisfy the above formula. Assuming $V^+=5V$ and $V^-=-5V$, and in this case, if the above formula is satisfied, $R2<R1$, that is, the length-to-width ratio of the TFT representing R1 (which may be understood as the first TFT) is smaller than that of the TFT representing R2 (which may be understood as the second TFT).

Providing TFT is mainly for simplifying the manufacturing process. The TFTs in the dummy area may be manufactured at the same time with the TFTs inside the panel. Then, only the mask needs to be changed, without additional processes. In this sense, the TFT may be used to replace the resistors.

In the above embodiment, the negative voltage line may be grounded to release the adsorbed charged ions (leading away), so as to better eliminate the afterimage and prevent subsequent charged ions from affecting the display effect again.

Third Embodiment

In the afterimage removing device provided by the embodiment of the present disclosure, it is not limited to use positive and negative voltage lines, a first voltage dividing circuit, a second voltage dividing circuit and a control switch to form positive-negative potential difference between a gate extension line and a dummy line. The potential difference for adsorbing charged ions may also be the potential difference between voltages of the same polarity. For example, the gate extension line is at 10 v, and the dummy line is at 1 v, and a potential difference may also be formed between the gate extension line and the dummy line. At this time, the gate extension line may absorb more negative charges than the dummy line. After alternatively changing the potential difference, if the gate extension line becomes 1 v, and the dummy line becomes 10 v, a potential difference may also be formed between the gate extension line and the dummy line. At this time, the dummy line may absorb more negative charges than the gate extension line. Further, the dummy line may be grounded to release the absorbed charges. Similarly, if the gate extension line and the dummy line both have negative voltages, a potential difference may also be formed. In this case, positive charged ions will be absorbed.

Therefore, in an embodiment, in the embodiment of the present disclosure, the active area includes a gate line, and the afterimage removing device includes: a gate extension line extended from the gate line in the active area, a first voltage line, a second voltage line, and a conductive line coupled between the first voltage line and the second voltage line and disposed opposite to the gate extension line. The voltage dividing circuits and the control switch in the above embodiment may also be omitted if there is no need to form the positive-negative potential difference, as long as with the voltages applied to the first voltage line and the second voltage line, a potential difference may be formed between the gate extension line and the conductive line coupled between the first voltage line and the second voltage line and disposed opposite to the gate extension line. The potential difference may be a positive-positive potential difference, a negative-negative potential difference or a positive-negative potential difference.

It should be noted that, in order to simplify the process, in the embodiments of the present disclosure, gate extension lines extended from the gate lines in the existing active area are utilized to form a potential difference for adsorbing charged ions. However, the embodiments of the present disclosure are not limited thereto, and another dummy line may also be separately provided. That is, a plurality of dummy lines are provided and the corresponding voltage signals are correspondingly input, so that potential differences between the dummy lines are formed, which may adsorb charged ions as well, and eliminate or alleviate the effect of afterimage. That is, there are many possible implementations of the afterimage removing device for adsorbing charged ions by forming a potential difference in the embodiments of the present disclosure.

The display substrate in the above embodiments of the present disclosure may also include a circuit for applying corresponding voltage signals to the positive voltage line and the negative voltage line in the afterimage removing device.

An embodiment of the present disclosure provides a display panel including the display substrate provided by the embodiments of the present disclosure.

For example, the display panel is a liquid crystal display panel. The display substrate includes, for example, an array substrate.

An embodiment of the present disclosure provides a display device including the display panel provided in the embodiment of the present disclosure. For example, the display device is a mobile phone, a television, a computer, a PAD and the like.

In summary, in the embodiments of the present disclosure, as a preferred mode, a dummy area is provided at the periphery of the AA (active area) area of the array substrate of the LCD panel, and a black matrix (BM) covers the part of the dummy area corresponding to the color film (CF) substrate of the LCD. The dummy area is not used for displaying, but only for absorbing positive and negative charged ions. A plurality of scan extension lines and corresponding dummy lines are provided inside the dummy area, and each dummy line is provided thereon 2 resistors and 1 TFT switch, or two TFT switches. The TFT switches are coupled to the gate driving lines corresponding to the dummy lines. By controlling the gate lines, each dummy line and corresponding gate line have opposite voltages, resulting in a positive-negative potential difference that absorbs positive and negative charged ions inside the liquid crystals at the periphery of the LCD panel, so as to effectively solve the peripheral afterimage problem of the LCD panel and improve the display quality of the LCD panel. Since each dummy line needs two kinds of voltages: positive and negative, only two signal transmission lines are needed in the dummy area to implement the voltage transmission, barely affecting the narrow bezel design. Two resistors R1 ($i$) and R2 ($i$) are required for an $i^{th}$ dummy line, and the configurations of the resistors may be set by a peripheral circuit. The configuration of the two resistors R1 (N) and R2 (N) may also be implemented by arranging TFT switches with different width-to-length ratios on the TFT display substrate (the larger the width-to-length ratio of the TFT is, the smaller the resistance is). This process may be completed during manufacturing of the TFT display substrate without any additional process.

Apparently, those skilled in the art may make various modifications and variations to the present disclosure without departing from the spirit and scope of the present disclosure. In this way, if these modifications and variations of the present disclosure fall within the scope of the claims of the disclosure and the equivalent technologies, the disclosure is also intended to include these modifications and variations.

What is claimed is:

1. A display substrate comprising
an active area,
a non-active area, and
an afterimage removing device, provided in the non-active area and adsorbing charged ions by forming a potential difference,
wherein the active area comprises a gate line, and the afterimage removing device comprises: a gate extension line extended from the gate line in the active area, a first voltage line, a second voltage line, and a conductive line coupled between the first voltage line and the second voltage line and disposed opposite to the gate extension line.

2. The display substrate according to claim 1, wherein afterimage removing device further comprises: a first voltage dividing circuit, a second voltage dividing circuit, and a control switch, wherein the conductive line is coupled in series between the first voltage dividing circuit and the second voltage dividing circuit, and the control switch comprises a first terminal, a second terminal and a control terminal;
one terminal of the first voltage dividing circuit is coupled to the first voltage line and the other terminal of the first voltage dividing circuit is coupled to the conductive line, one terminal of the second voltage dividing circuit is coupled to the conductive line and the other terminal of the second voltage dividing circuit is coupled to the first terminal of the control switch, and the second terminal of the control switch is coupled to the second voltage line and the control terminal of the control switch is coupled to the gate extension line.

3. The display substrate according to claim 2, wherein when the control switch is turned on, a voltage applied by the control terminal is not equal to a voltage of the conductive line.

4. The display substrate according to claim 3, wherein the first voltage line is a positive voltage line, the second voltage line is a negative voltage line, the control terminal is at a high voltage, the control switch is turned on, and the control switch is an N-type thin film transistor.

5. The display substrate according to claim 3, wherein the first voltage line is a positive voltage line, the second voltage line is a negative voltage line, the control terminal is at a low voltage, the control switch is turned on, and the control switch is a P-type thin film transistor.

6. The display substrate according to claim 3, wherein the first voltage line is a negative voltage line, the second voltage line is a positive voltage line, the control terminal is at a high voltage, the control switch is turned on, and the control switch is an N-type thin film transistor.

7. The display substrate according to claim 3, wherein the first voltage line is a negative voltage line, the second voltage line is a positive voltage line, the control terminal is at a low voltage, the control switch is turned on, and the control switch is a P-type thin film transistor.

8. The display substrate according to claim 4, wherein the first voltage dividing circuit is a first resistor and the second voltage dividing circuit is a second resistor.

9. The display substrate according to claim 8, wherein the resistances of the first resistor and the second resistor satisfy the following condition:

$$VL = \frac{R_2 * V^+}{R_1 + R_2} + \frac{R_1 * V^-}{R_1 + R_2}$$

where VL denotes a voltage of the conductive line when the first terminal and the second terminal are conducted, $R_1$ and $R_2$ denote the resistances of the first resistor and the second resistor respectively, $V^+$ and $V^-$ respectively represent a positive voltage of the positive voltage line and a negative voltage of the negative voltage line.

10. The display substrate according to claim 1, wherein the afterimage removing device comprises: a positive voltage line, a negative voltage line, a gate extension line extended from a gate line in the active area, and a first thin film transistor, a second thin film transistor and a conductive line disposed opposite to the gate extension line, wherein a gate electrode of each thin film transistor is electrically coupled to the gate extension line, the conductive line is coupled in series between a source electrode of the first thin film transistor and a drain electrode of the second thin film transistor, a drain electrode of the first thin film transistor is coupled to the positive voltage line, and a source electrode of the second thin film transistor is coupled to the negative voltage line.

11. The display substrate according to claim 1, wherein the conductive line and a corresponding gate extension line are parallel to each other.

12. A display device comprising the display substrate of claim 1.

13. The display substrate according to claim 5, wherein the first voltage dividing circuit is a first resistor and the second voltage dividing circuit is a second register.

14. The display substrate according to claim 13, wherein the resistance of the first resistor and the second resistor satisfy the following condition:

$$VL = \frac{R_2 * V^+}{R_1 + R_2} + \frac{R_1 * V^-}{R_1 + R_2}$$

wherein VL denotes a voltage of the conductive line when the first terminal and the second terminal are conducted, $R_1$ and $R_2$ denote the resistances of the first resistor and the second resistor respectively, $V^+$ and $V^-$ respectively represent a positive voltage of the positive voltage line and a negative voltage of the negative voltage line.

15. The display substrate according to claim 6, wherein the first voltage dividing circuit is a first resistor and the second voltage dividing circuit is a second resistor.

16. The display substrate according to claim 15, wherein the resistances of the first resistor and the second resistor satisfy the following condition:

$$VL = \frac{R_2 * V^+}{R_1 + R_2} + \frac{R_1 * V^-}{R_1 + R_2}$$

wherein VL denotes a voltage of the conductive line when the first terminal and the second terminal are conducted, $R_1$ and $R_2$ denote the resistances of the first resistor and the second resistor respectively, $V^+$ and $V^-$ respectively represent a positive voltage of the positive voltage line and a negative voltage of the negative voltage line.

17. The display substrate according to claim 7, wherein the first voltage dividing circuit is a first resistor and the second voltage dividing circuit is a second resistor.

18. The display substrate according to claim 17, wherein the resistances of the first resistor and the second resistor satisfy the following condition:

$$VL = \frac{R_2 * V^+}{R_1 + R_2} + \frac{R_1 * V^-}{R_1 + R_2}$$

where VL denotes a voltage of the conductive line when the first terminal and the second terminal are conducted, $R_1$ and $R_2$ denotes the resistances of the first resistor and the second resistor respectively, $V^+$ and $V^-$ respectively represent a positive voltage of the positive voltage line and a negative voltage of the negative voltage line.

* * * * *